(12) United States Patent
He et al.

(10) Patent No.: US 11,609,656 B2
(45) Date of Patent: Mar. 21, 2023

(54) TOUCH MODULE, DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Fan He, Beijing (CN); Xiangdan Dong, Beijing (CN); Hongwei Ma, Beijing (CN); Jun Yan, Beijing (CN); Kemeng Tong, Beijing (CN); Cong Fan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/265,207

(22) PCT Filed: Apr. 30, 2020

(86) PCT No.: PCT/CN2020/088409
§ 371 (c)(1),
(2) Date: Feb. 2, 2021

(87) PCT Pub. No.: WO2021/217614
PCT Pub. Date: Nov. 4, 2021

(65) Prior Publication Data
US 2022/0113854 A1 Apr. 14, 2022

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0443* (2019.05); *G06F 3/0446* (2019.05);
(Continued)

(58) Field of Classification Search
None
See application file for complete search history.

(56) References Cited

U.S. PATENT DOCUMENTS

2016/0118451 A1* 4/2016 Youn ................. H01L 29/78603
257/66
2016/0378224 A1* 12/2016 Kwon ................. H01L 51/5256
345/174
(Continued)

FOREIGN PATENT DOCUMENTS

| CN | 105742330 A | 7/2016 |
| CN | 106293197 A | 1/2017 |
| CN | 108183121 A | 6/2018 |

*Primary Examiner* — Christopher R Lamb
(74) *Attorney, Agent, or Firm* — Ling Wu; Stephen Yang; Ling and Yang Intellectual Property

(57) ABSTRACT

The present disclosure provides a touch module, a display panel and a display apparatus. The display panel includes a substrate, a driving circuit structure layer, a light-emitting layer including a plurality of light-emitting regions and non-light-emitting regions, an encapsulation layer arranged on a surface of the light-emitting layers away from the substrate, an insulating dielectric layer with a plurality of hollow patterns penetrating the insulating dielectric layer, including a touch region, a peripheral signal trace region, and a frame region, touch electrode pattern, arranged on a surface of the insulating dielectric layer, located in the touch region and including a plurality of first touch electrodes and a plurality of second touch electrodes, and a plurality of touch signal lines distributed at intervals, electrically connected to the touch electrode patterns.

18 Claims, 6 Drawing Sheets

(51) Int. Cl.
*H01L 27/32* (2006.01)
*H01L 51/52* (2006.01)

(52) U.S. Cl.
CPC ........ *H01L 27/323* (2013.01); *H01L 27/3276* (2013.01); *H01L 51/5203* (2013.01); *H01L 51/5253* (2013.01); *G06F 2203/04103* (2013.01); *G06F 2203/04111* (2013.01); *H01L 2227/323* (2013.01)

(56) References Cited

U.S. PATENT DOCUMENTS

| | | | |
|---|---|---|---|
| 2017/0364187 A1* | 12/2017 | Zhai | G06F 3/0446 |
| 2018/0158876 A1 | 6/2018 | Shi | |
| 2018/0348930 A1* | 12/2018 | Lee | G06F 3/047 |
| 2019/0212847 A1* | 7/2019 | Na | G06F 3/0443 |
| 2019/0267558 A1* | 8/2019 | Wang | H01L 27/3262 |

\* cited by examiner

TOUCH MODULE, DISPLAY PANEL AND DISPLAY APPARATUS

TECHNICAL FIELD

The present disclosure relates to the field of touch technology, in particular to a touch module, a display panel and a display apparatus.

BACKGROUND

With the rapid development of AMOLED technology, the development of smart phones has entered an era of full screen and foldable screen. In order to provide better user experience, products such as curlable-wearable products and foldable products will become an important developing direction of the display field in the future definitely. In recent years, curlable-wearable products and foldable products have attracted more and more attention, and FMLOC technology based on the touch of these products is particularly critical. However, due to the actions such as curling and folding, the requirements for the screen are getting increasingly higher, and the phenomenon of metal trace crack during curling and folding becomes more evident. Similarly, the FMLOC touch technology (namely, the Y-octa technology, is a technology that forms Tx and Rx channels in the FMLOC technology by directly manufacturing Metal Mesh trace through processes on the display region of back panel circuit to achieve touch functions) also encounters such a problem. However, in the foldable FMLOC products, since the stress of the insulating dielectric layer in the touch module cannot be effectively released, the rupture of the insulating dielectric layer could cause the FMLOC metal trace to break, which leads to disconnection of the FMLOC signal channels and abnormal transmission of signals, thereby affecting the touch performances.

Therefore, a deep research on the touch module in the display panel is required.

SUMMARY

The present disclosure is intended to solve one of the technical problems in the related art at least to some extent. Therefore, an object of the present disclosure is to provide a display panel. In the display panel, a touch electrode pattern of a touch module is not prone to break during folding and curling, so as to ensure good touch performances of the display apparatus.

In one aspect of the present disclosure, the present disclosure provides a display panel. According to an embodiment of the present disclosure, the display panel includes a substrate, a driving circuit structure layer arranged on one surface of the substrate, a light-emitting layer arranged on a surface of the driving circuit layer away from the substrate, an encapsulation layer arranged on a surface of the light-emitting layer away from the substrate, an insulating dielectric layer, touch electrode patterns, and a plurality of touch signal lines distributed at intervals. The light-emitting layer includes a plurality of light-emitting regions and non-light-emitting regions between two adjacent light-emitting regions. The insulating dielectric layer is arranged on a surface of the encapsulation layer away from the substrate. The insulating dielectric layer is provided with a plurality of hollow patterns, and includes a touch region, a peripheral signal trace region around the touch region, and a frame region around the peripheral signal trace region. The touch electrode patterns are arranged on a surface of the insulating dielectric layer and in the touch region. The touch electrode patterns include a plurality of first touch electrodes distributed at intervals in a first direction, and a plurality of second touch electrodes distributed at intervals in a second direction, insulated and spaced apart from the first touch electrodes. The first direction intersects with the second direction. The plurality of touch signal lines are arranged on a surface of the insulating dielectric layer and in the peripheral signal trace region. The touch signal lines are electrically connected to the touch electrode patterns. The hollow patterns are arranged around the touch electrode patterns and/or the touch signal lines. An orthographic projection of at least part of the hollow patterns on the substrate does not overlap with orthographic projections of the touch electrode patterns, the touch signal lines and the light-emitting regions on the substrate. As a result, a plurality of hollow patterns are arranged in the insulating dielectric layer, so that the hollow patterns may effectively release the stress caused by curling and folding of the display panel or display screen with the touch module, thereby avoiding the breakage of the touch electrode patterns and the disconnection of the touch signal channels, namely effectively achieving the purpose of protecting the touch electrode patterns.

According to an embodiment of the present disclosure, the first touch electrodes and the second touch electrodes are arranged on the same surface of the insulating dielectric layer. The display panel further includes bridge electrodes arranged on another surface of the insulating dielectric layer away from the first touch electrodes. The first touch electrodes include a plurality of first touch sub-electrodes distributed at intervals along the second direction. The bridge electrodes are electrically connected to two adjacent first touch sub-electrodes through first via holes penetrating the insulating dielectric layer.

According to an embodiment of the present disclosure, the plurality of hollow patterns include a plurality of first strip-shaped grooves and/or a plurality of first via holes distributed at intervals.

According to an embodiment of the present disclosure, the first touch electrodes and the second touch electrodes both include a plurality of grid structures. The grid structures are polygonal, and an orthographic projection of the grid structures on the substrate does not overlap with the light-emitting regions. The hollow patterns are a plurality of first via holes distributed at intervals. The plurality of first via holes are substantially arranged along an edge of the grid structures. An orthographic projection of the plurality of first via holes on the substrate is located between an orthographic projection of the light-emitting regions on the substrate and an orthographic projection of the grid structures on the substrate.

According to an embodiment of the present disclosure, the first touch electrodes and the second touch electrodes both include a plurality of grid structures. The grid structures are polygonal, and the orthographic projection of the grid structures on the substrate does not overlap with the light-emitting regions. The hollow patterns are a plurality of first strip-shaped grooves substantially extending along at least one edge of the grid structures. At least part of an orthographic projection of the first strip-shaped grooves on the substrate is located between the orthographic projection of the light-emitting regions on the substrate and the orthographic projection of the grid structures on the substrate.

According to an embodiment of the present disclosure, each of the light-emitting regions is located in one of the grid structures. The first strip-shaped grooves intersect with the plurality of the grid structures. Two adjacent first strip-shaped grooves are respectively positioned on two sides opposite to each other of the light-emitting regions.

According to an embodiment of the present disclosure, the hollow patterns are further arranged on one side of the touch signal lines away from the touch region.

According to an embodiment of the present disclosure, the hollow patterns are a plurality of second strip-shaped grooves. The extending direction of the second strip-shaped grooves is parallel or perpendicular to extending direction of the touch signal lines.

According to an embodiment of the present disclosure, the touch signal lines include a first touch signal line arranged on one side of the insulating dielectric layer away from the substrate, and a second touch signal line arranged on one side of the insulating dielectric layer close to the substrate. The first touch signal line is electrically connected to the second touch signal line through a second via penetrating the insulating dielectric layer.

According to an embodiment of the present disclosure, depth of the hollow patterns is less than or equal to thickness of the insulating dielectric layer.

According to an embodiment of the present disclosure, at least part of the grid structures has second via holes penetrating the grid structures.

According to an embodiment of the present disclosure, the first via holes meet at least one of the following conditions: inner diameter of the first via holes being 3-5 microns; distance between two adjacent first via holes being 3-5 microns; distance between the first via holes and the first touch electrodes, and distance between the first via holes and the second touch electrodes being less than or equal to 5 microns respectively; distance between the first via holes and the touch signal lines being less than or equal to 5 microns.

According to an embodiment of the present disclosure, the first strip-shaped grooves meet at least one of the following conditions: width of the first strip-shaped grooves being 3-5 microns; distance between the first strip-shaped grooves and the first touch electrodes, and distance between the first strip-shaped grooves and the second touch electrodes being less than or equal to 5 microns respectively; distance between the first strip-shaped grooves and the touch signal lines being less than or equal to 5 microns.

According to an embodiment of the present disclosure, the width of the second strip-shaped grooves is 10-20 microns. The distance between two adjacent second strip-shaped grooves is 5-8 microns.

According to an embodiment of the present disclosure, the width of each of the grid structures is d, the inner diameter of a second via hole is r, and $d/4 \leq r \leq d/3$.

According to an embodiment of the present disclosure, d is 10-15 microns, and the distance between two adjacent second via holes is 3-5 microns.

According to an embodiment of the present disclosure, the display panel includes a first electrode, a pixel defining layer, an organic light-emitting layer, and a second electrode. The pixel defining layer is arranged on a surface of the driving circuit structure layer, away from the substrate, and defines a plurality of pixel opening. The organic light-emitting layer is arranged in the plurality of pixel openings. The second electrode is arranged on one side of the organic light-emitting layer, away from the first electrodes An orthographic projection of the hollow patterns on the substrate is located within an orthographic projection of the pixel defining layer on the substrate.

In another aspect of the present application, the present application provides a touch module. According to an embodiment of the present disclosure, the touch module includes an insulating dielectric layer, and touch electrode patterns arranged on a surface of the insulating dielectric layer. The touch electrode patterns include a plurality of first touch electrodes distributed at intervals in a first direction, and a plurality of second touch electrodes distributed at intervals in a second direction, insulated and spaced apart from the first touch electrodes. The first direction intersects with the second direction. The first touch electrodes and the second touch electrodes both include a plurality of grid structures. At least a part of the grid structures have a plurality of second via holes penetrating the grid structures. Therefore, due to the arrangement of the second via holes, the stress caused by folding and curling of the touch electrode patterns may be directly released, so as to avoid the breakage of the touch electrode patterns and avoid affecting the signal transmission.

In another aspect of the present application, the present application provides a touch module. According to an embodiment of the present application, the touch module includes an insulating dielectric layer with a plurality of hollow patterns, touch electrode patterns arranged on a surface of the insulating dielectric layer and in the touch region, and a plurality of touch signal lines distributed at intervals. The insulating dielectric layer includes a touch region, a peripheral signal trace region around the touch region, and a frame region around the peripheral signal trace region. The touch electrode patterns include a plurality of first touch electrodes distributed at intervals in a first direction, and a plurality of second touch electrodes distributed at intervals in a second direction, insulated and spaced apart from the first touch electrodes. The first direction intersects with the second direction. The touch signal lines are arranged on a surface of the insulating dielectric layer and in the peripheral signal trace region. The touch signal lines are electrically connected to the touch electrode patterns. The hollow patterns are arranged around the touch electrode patterns and/or the touch signal lines. At least part of the hollow patterns does not overlap with the touch electrode patterns and the touch signal lines. As a result, a plurality of hollow patterns are arranged in the insulating dielectric layer, so that during the processes of curling and folding of the display panel or display screen with the touch module, the hollow patterns may effectively allow the stress caused by curling and folding released, thereby avoiding the breakage of the touch electrode patterns and the disconnection of the touch signal channels, namely effectively achieving the purpose of protecting the touch electrode patterns.

DETAILED DESCRIPTION

Figure 1:
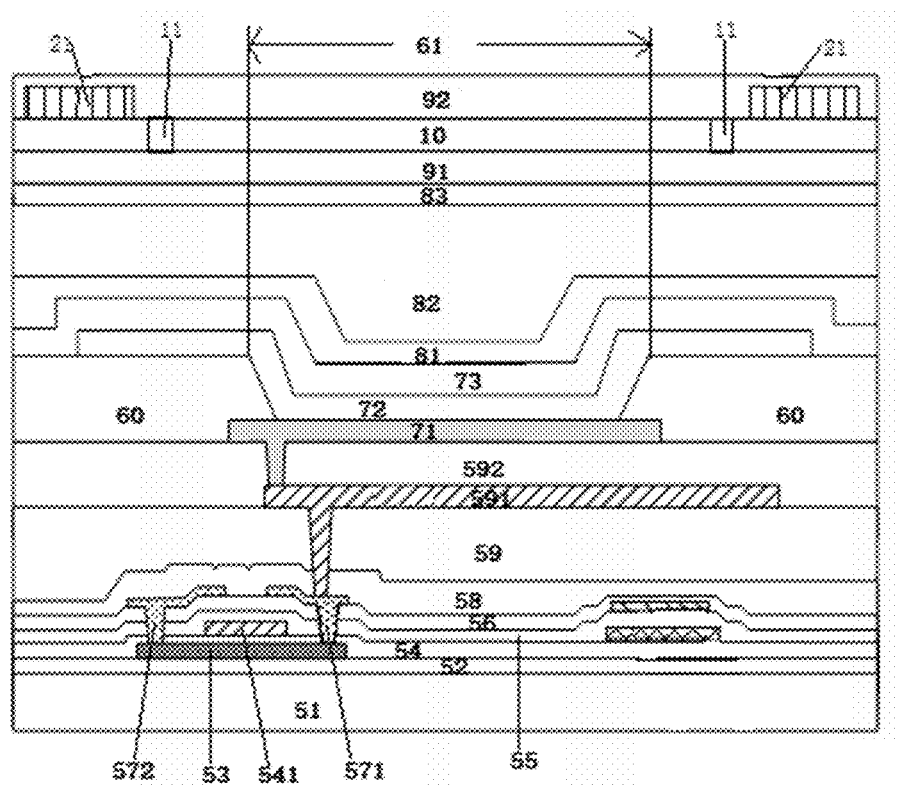
FIG. 1 is a structural schematic diagram of a display panel according to one embodiment of the present disclosure.

Descriptions will now be made in detail to embodiments of the present disclosure, examples of the embodiments are illustrated in the accompanying drawings. The same or similar elements or the elements having same or similar functions are denoted by same or similar reference numerals throughout the descriptions. The embodiments described below with reference to the drawings are exemplary, and are merely intended to explain the present disclosure, and cannot be construed as limiting the present disclosure.

It should be noted that terms "first" and "second" are used for description purposes only, and cannot be construed as indicating or implying relative importance or implicitly indicating the quantity of technical features referred to. Thus, the features defined with "first" and "second" may include one or more of the features explicitly or implicitly. Furthermore, in the description of the present disclosure, unless otherwise specified, "a plurality of" means two or more.

Figure 2:
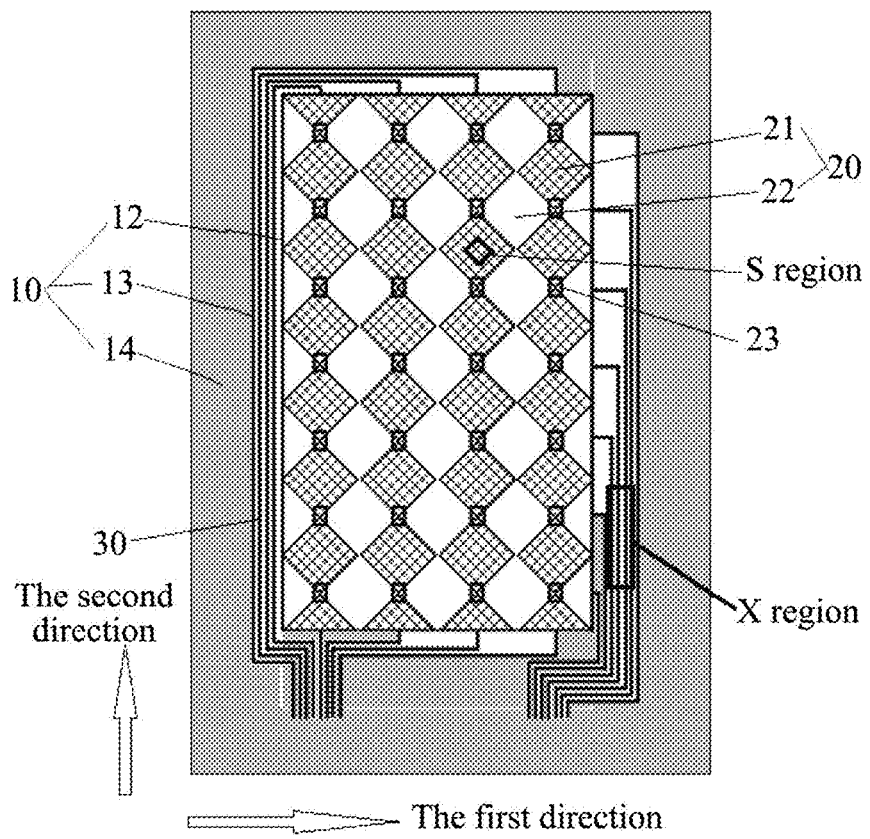
FIG. 2 is a schematic diagram of a planar structure of a touch module in a display panel according to one embodiment of the present disclosure.
Figure 3:
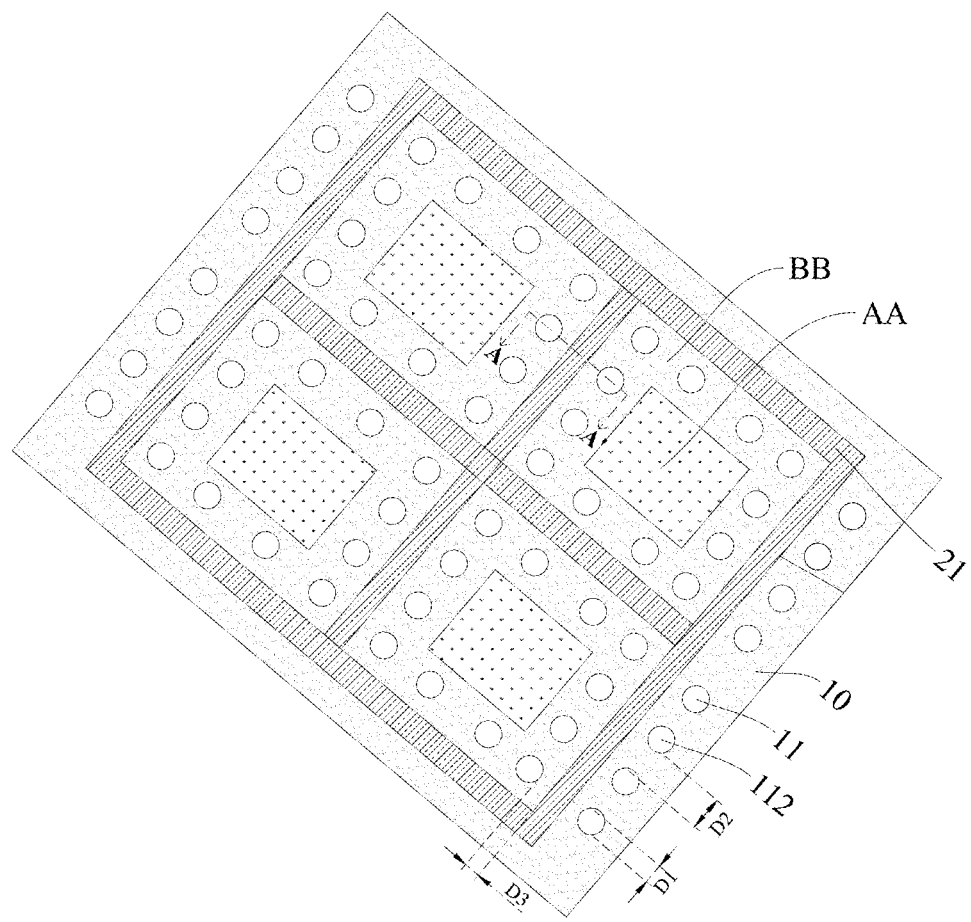
FIG. 3 is an enlarged diagram of S region in FIG. 1.
Figure 4:
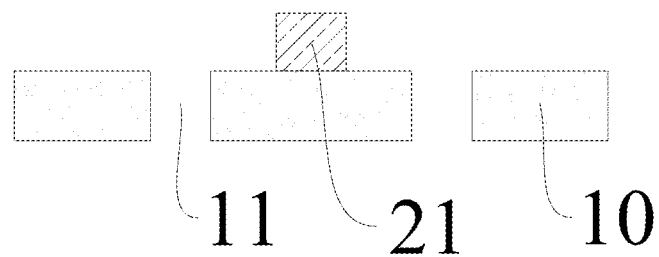
FIG. 4 is a cross-sectional diagram along AA' of the touch module in FIG. 3.
Figure 5:
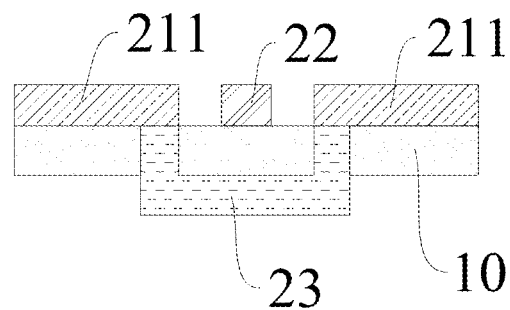
FIG. 5 is a cross-sectional diagram at the bridge electrodes in FIG. 2.
Figure 6:
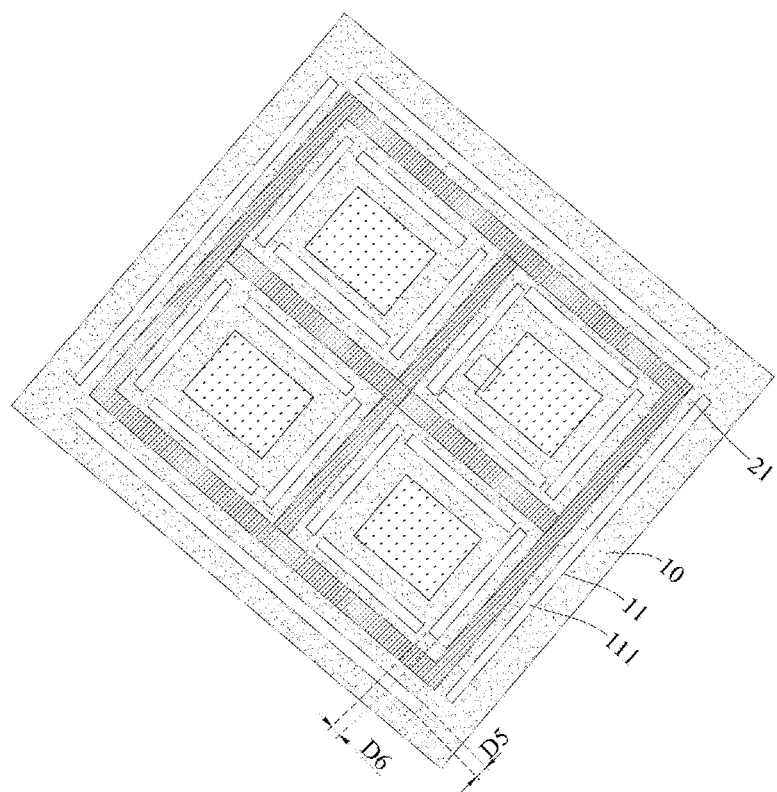
FIG. 6 is an enlarged diagram of the S region in FIG. 1 according to another embodiment of the present disclosure.
Figure 7:
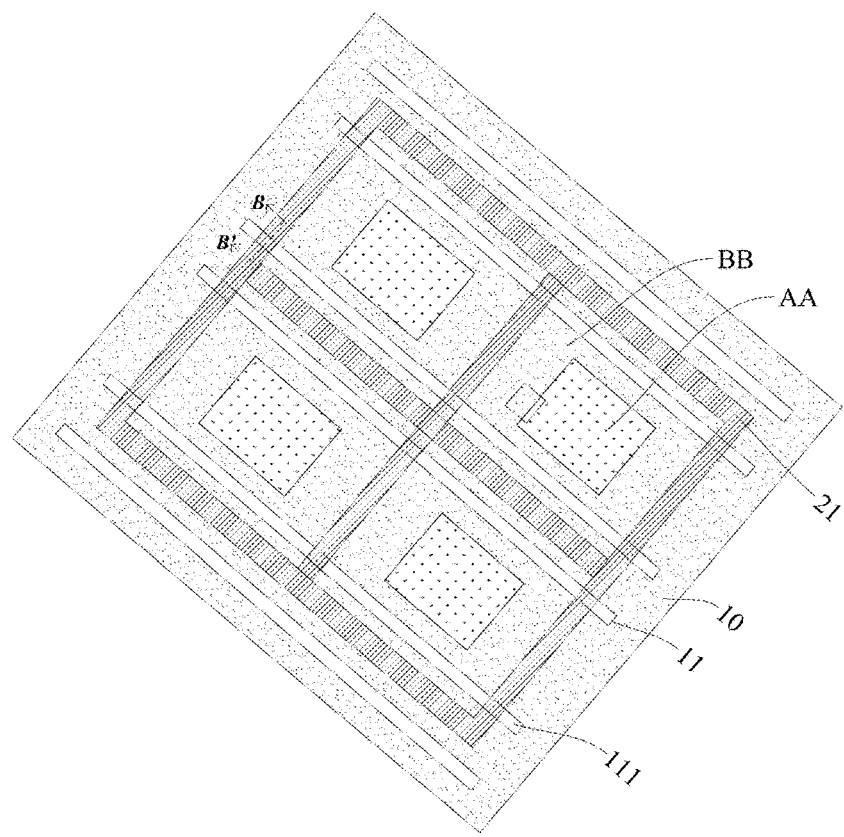
FIG. 7 is a large version of the S region in FIG. 1 according to another embodiment of the present disclosure.

In one aspect of the present disclosure, the present disclosure provides a display panel. According to an embodiment of the present disclosure, referring to FIG. 1 to FIG. 9 (FIG. 3, FIG. 6 and FIG. 7 are large version of the S region in FIG. 2, in which the structure of the insulating dielectric layer in the touch region and peripheral signal trace region in FIG. 2 is not shown for ease of describing the touch electrode patterns; and FIG. 9 is a large version of the X region in FIG. 2), the display panel includes a substrate 51; a driving circuit structure layer, arranged on one surface of the substrate 51; a light-emitting layer, arranged on a surface of the driving circuit layer away from the substrate 51 and includes a plurality of light-emitting regions AA and non-light-emitting regions BB between two adjacent light-emitting regions; an encapsulation layer, arranged on a surface of the light-emitting layer away from the substrate 51; an insulating dielectric layer 10, provided with a plurality of hollow patterns 11 (not shown in FIG. 2), and includes a touch region 12, a peripheral signal trace region 13 around the touch region 12, and a frame region 14 around the peripheral signal trace region 13; a touch electrode pattern 20, arranged on a surface of the insulating dielectric layer 10, located in the touch region 12, and including a plurality of first touch electrodes 21 distributed at intervals in a first direction, a plurality of second touch electrodes 22 distributed at intervals in a second direction, insulated and spaced apart from the first touch electrodes 21, herein, the first direction intersects with the second direction; and a plurality of touch signal lines 30, connected to the touch electrode patterns 20, distributed at intervals signal line arranged on a surface of the insulating dielectric layer 10 and located in the peripheral signal trace region 13. signal line. Herein, the hollow patterns 11 are arranged around the touch electrode patterns 20 and/or the touch signal lines 30. An orthographic projection of at least part of the hollow patterns 11 on the substrate 51 does not overlap with the orthographic projections of the touch electrode patterns 20, the touch signal lines 30 and the light-emitting regions AA on the substrate 10. As a result, a plurality of hollow patterns are arranged in the insulating dielectric layer, so that during the curling and folding processes of the display panel and display screen with the touch module, the hollow patterns may effectively allow the stress caused by the curling and folding released, thereby avoiding the breakage of the touch electrode patterns and/or the touch signal lines, and avoiding the disconnection of the touch signal channels, namely effectively achieving the purpose of protecting the touch electrode patterns and/or the touch signal lines. In addition, when an external force is applied, the hollow patterns may form a blocking force to further protect the touch electrode patterns and/or the touch signal lines.

According to an embodiment of the present disclosure, referring to FIG. 1, the display panel further includes a buffer layer 52 arranged between the substrate 51 and the driving circuit structure layer. The driving circuit structure layer includes, in the direction away from the substrate 51, an active layer 53, a first gate insulating layer 54, a gate electrode 541, a first interlayer dielectric layer 55, a first interlayer dielectric layer 56, a drain electrode 571, a source electrode 572, a second gate insulating layer 58, a first flat layer 59, a conductive connection layer 591 (the conductive connection layer is electrically connected to the drain electrode through a via hole), and a second flat layer 592, which are sequentially arranged.

According to an embodiment of the present disclosure, referring to FIG. 1, a display panel includes a first electrode 71, a pixel define layer 60 which is arranged on a surface of the driving circuit structure layer away from the substrate 51 (i. e., the surface of the second flat layer 592 away from the substrate) and defines a plurality of pixel openings 61, an organic light-emitting layer 72 arranged in the plurality of pixel openings 61, and a second electrode 73 arranged on a side of the organic light-emitting layer 72 away from the first electrode 71. An orthographic projection of the hollow patterns 11 on the substrate 10 is located within the orthographic projection of the pixel defining layer 60 on the substrate 10. Therefore, the FMLOC display screen with such a structure are provided with better folding and curling performances, and the touch electrode patterns are not prone to break.

According to embodiments of the present disclosure, the specific structure of the touch module (including the insulating dielectric layer and the touch electrode patterns) is not particularly limited, thereby those skilled are provided flexibility of selection according to specific conditions. In some embodiments, referring to FIG. 2 and FIG. 5 (FIG. 5 is a cross-sectional diagram of the touch module at the bridge electrodes 23 in FIG. 2), the first touch electrodes 21 and the second touch electrodes 22 are arranged on the same surface of the insulating dielectric layer 10. The first touch electrodes 21 include a plurality of first touch sub-electrodes 211 distributed at intervals along the second direction. The display panel further includes bridge electrodes 23 arranged on another surface of the insulating dielectric layer 10 away from the first touch electrodes 21, and electronically connected to two adjacent first touch sub-electrodes 211 through first vias penetrating the insulting dielectric layer 10. In some other embodiments, the first touch electrodes 21 and the second touch electrodes 22 are respectively arranged on two surfaces opposite to each other of the insulating dielectric layer 10, and in this case there is no need to arrange a bridge electrode.

It should be noted that one of the first touch electrode 21 and the second touch electrode 22 serves as a driving electrode (Tx) and the other serves as a sensing electrode (Rx).

There is no special requirement for the specific materials of the insulating dielectric layer, and those skilled in the art may flexibly select the materials that may be used to form the insulating dielectric layer in the prior arts according to the actual situation. For example, the materials for forming the insulating dielectric layer include but are not limited to silicon nitride, silicon oxide, silicon oxynitride, and organic insulating materials, etc.

According to an embodiment of the present disclosure, referring to FIG. 3 and FIG. 6, the plurality of hollow patterns 11 include a plurality of first strip-shaped grooves 111 (as shown in FIG. 6) and/or a plurality of first via holes distributed at intervals (as shown in FIG. 2). As a result, both the first strip-shaped grooves 111 and the first via holes 112 may effectively make the stress caused by curling and folding released, and are also convenient for manufacturing and designing in terms of process. In addition, in the case the hollow patterns are the first strip-shaped grooves, if the extension direction along the length of the first strip-shaped grooves is consistent with the folding direction of the display panel (or in another word, is consistent with the extension direction of the touch signal lines), the first strip-shaped grooves may make the stress released better. There is no special requirement for the specific shape of the first via holes, and it may be any shape such as a circular shape, an oval shape, a rectangle shape, etc., which is not limited here.

According to an embodiment of the present disclosure, referring to FIG. 3, both the first touch electrodes 21 and the second touch electrodes 22 (taking the first touch electrodes 21 as an example in the figure) include a plurality of grid structures. The grid structures are polygonal (taking the quadrilateral shape as an example in FIG. 3), and an orthographic projection on the substrate does not overlap with the light-emitting regions AA. The hollow patterns 11 are a plurality of first via holes 112 distributed at intervals. The plurality of first via holes 112 are substantially arranged along the edge of the grid structures, and an orthographic projection of the first via holes 112 on the substrate 51 is located between an orthographic projection of the light-emitting regions AA on the substrate and an orthographic projection of the grid structures on the substrate 51. As a result, the arrangement of the first via holes does not negatively affect the light-emitting effect of the light-emitting regions and the image display of the display panel at the same time of making stress released.

According to an embodiment of the present disclosure, referring to FIG. 6, both the first touch electrodes 21 and the second touch electrodes 22 (taking the first touch electrodes 21 as an example in the figure) include a plurality of grid structures. The grid structures are polygonal (taking the quadrilateral shape as an example in FIG. 6), and an orthographic projection on the substrate does not overlap with the light-emitting regions AA. The hollow patterns 11 are a plurality of first strip-shaped grooves 111. The first strip-shaped grooves 111 extend along at least one edge of the grid structures substantially. At least part of the orthographic projection of the first strip-shaped grooves 111 on the substrate is located between an orthographic projection of the light-emitting regions AA on the substrate and an orthographic projection of the grid structures on the substrate. As a result, the arrangement of the first strip-shaped grooves will not negatively affect the light-emitting effect of the light-emitting region and the image display of the display panel at the same time of making stress released.

Figure 8:
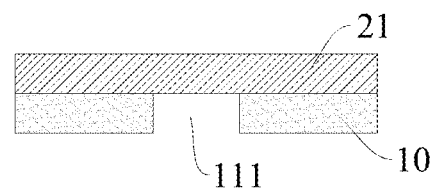
FIG. 8 is a cross-sectional diagram along BB' in FIG. 7.
Figure 9:
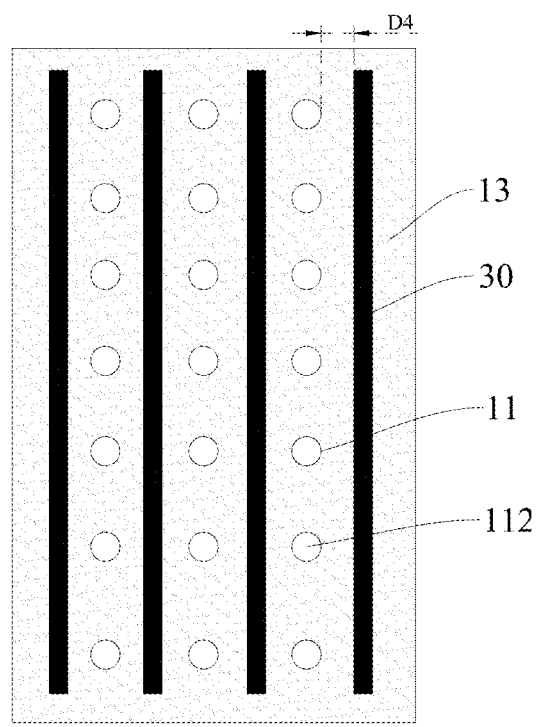
FIG. 9 is a large version of X region in FIG. 1.

According to an embodiment of the present disclosure, referring to FIG. 7 and FIG. 8 (FIG. 8 is a cross-sectional diagram along BB' of the touch module in FIG. 7), each of the light-emitting regions AA is located within one of the grid structures. The first strip-shaped grooves 111 intersect with a plurality of the grid structures. Two adjacent first strip-shaped grooves 111 (i.e., two adjacent first strip-shaped grooves spanning the grid structures of the same column or row) are respectively located on two sides opposite to each other of the light-emitting regions AA. As a result, it is convenient to manufacture the first strip-shaped grooves, and the stress may still be well released to protect the touch electrode patterns, without negatively affecting the light-emitting effect of the light-emitting regions and the image display of the display panel.

According to an embodiment of the present disclosure, as shown in FIG. 2 and FIG. 9, the first via hole 112 meet at least one of the following conditions: the inner diameter D1 of a first via hole 112 being 3-5 microns (such as 3 microns, 3.5 microns, 4 microns, 4.5 microns or 5 microns); the distance D2 between two adjacent first via holes being 3-5 microns (such as 3 microns, 3.5 microns, 4 microns, 4.5 microns or 5 microns); the distances D3 between the first via holes 112 and the first touch electrodes 21, or between the first via holes 112 and the second touch electrodes 22 being less than or equal to 5 microns (for example, 5 microns, 4 microns, 3 microns, 2 microns, 1 micron or 0) respectively; the distance D4 between the first via hole 112 and the touch signal line 30 being less than or equal to 5 microns (such as 5 microns, 4 microns, 3 microns, 2 microns, 1 micron or 0). As a result, under the above-mentioned conditions of size, the first via holes 112 may allow the stress caused by folding and curling of the insulating dielectric layer, the touch electrode patterns and the touch signal lines released in a better way, without affecting the service performances of the touch module.

According to an embodiment of the present disclosure, referring to FIG. 6, the first strip-shaped grooves 111 meet at least one of the following conditions: the width D5 of a first strip-shaped groove 111 being 3-5 microns (such as 3 microns, 3.5 microns, 4 microns, 4.5 microns or 5 microns); the distances D6 between the first strip-shaped grooves 111 and the first touch electrodes 21, and between the first strip-shaped grooves 111 and the second touch electrodes 22 being less than or equal to 5 microns, respectively; the distance between the first strip-shaped grooves and the touch signal lines (not shown in the figure) being less than or equal to 5 microns (such as 5 microns, 4 microns, 3 microns, 2 microns, 1 micron or 0). Under the above-mentioned conditions of size, the first strip-shaped grooves 111 may allow the stress caused by folding and curling of the insulating dielectric layer, the touch electrode patterns and the touch signal lines released in a better way, without affecting the service performances of the touch module.

It should be further noted that the distances D3 between the first via hole 112 (or the first strip-shaped groove 111) and the first touch electrodes 21, or between the first via hole 112 (or the first strip-shaped grooves 111) and the second touch electrodes 22 are less than or equal to 5 microns respectively, which means that the distance between the first via hole 112 (or the first strip-shaped groove 111) and the nearest first touch electrode forming the grid structures is less than or equal to 5 microns, and the distance between the first via hole 112 (or the first strip-shaped groove 111) and the nearest second touch electrode forming the grid structures is less than or equal to 5 microns. The distance between the first via hole 112 (or the first strip-shaped groove 111) and the touch signal line 30 is less than or equal to 5 microns, which means that the distance between the first via hole 112 (or the first strip-shaped groove 111) distributed on at least one side of the touch signal lines 30 in the direction along the width of the touch signal lines 30 and the touch signal lines 30 is less than or equal to 5 microns signal line.

Figure 10:
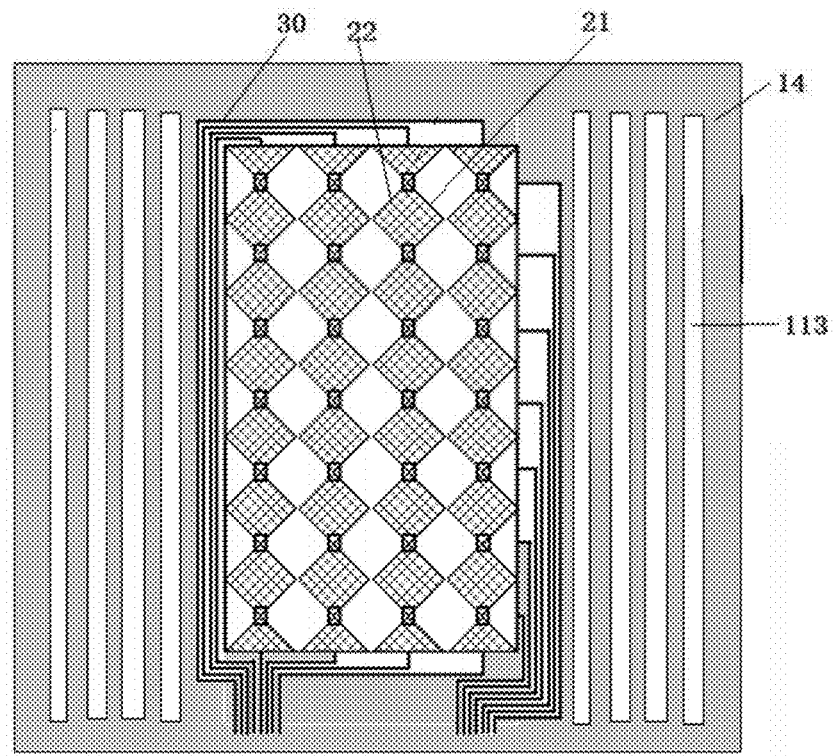
FIG. 10 is a structural schematic diagram of a touch module in a display panel according to another embodiment of the present disclosure.
Figure 11:
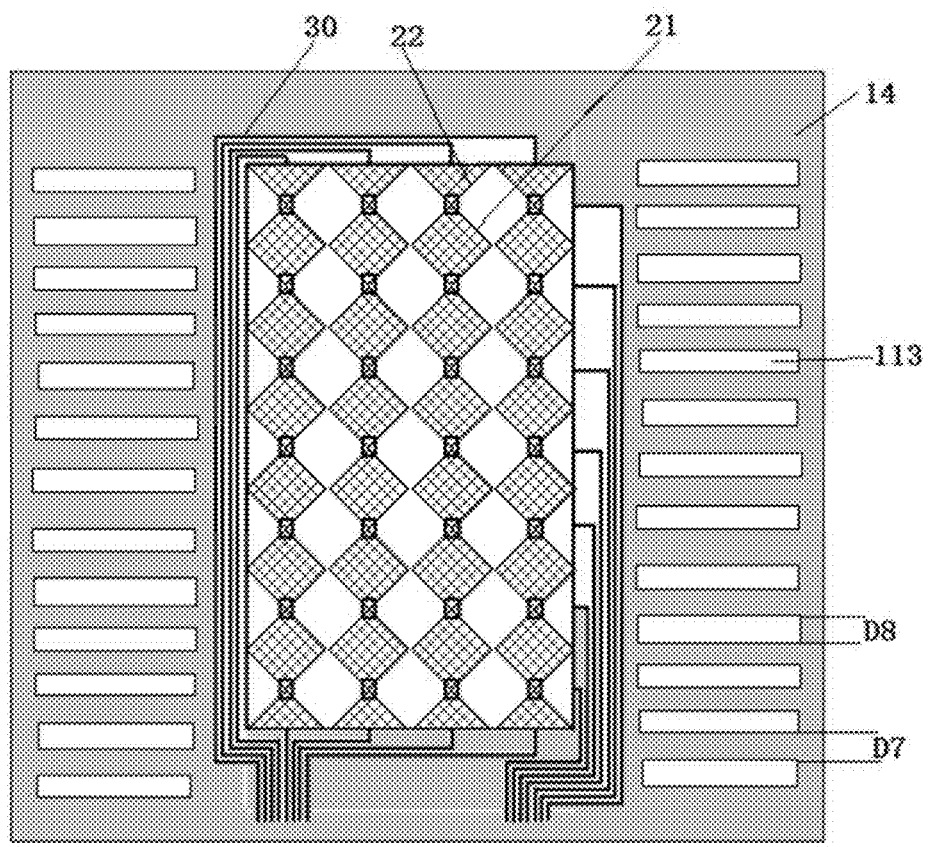
FIG. 11 is a structural schematic diagram of a touch module in a display panel according to another embodiment of the present disclosure.

According to an embodiment of the present disclosure, referring to FIG. 10 and FIG. 11, the hollow patterns 11 are further arranged on one side of the touch signal lines 30 away from the touch region 12 (i.e., the hollow patterns 11 are also arranged in the frame region 14 of the insulating dielectric layer 10). Therefore, arranging the hollow patterns in the frame region may further allow the stress caused by folding and curling of the insulating dielectric layer released, and thereby avoiding the adverse phenomenon of the touch electrode patterns and the touch signal lines breakage due to the unreleased stress of the insulating dielectric layer.

According to an embodiment of the present disclosure, referring to FIG. 10 and FIG. 11, the hollow patterns 11 in the frame region 14 are a plurality of second strip-shaped grooves 113. The extending direction of the plurality of second strip-shaped grooves 113 is parallel or perpendicular to the extending direction of the touch signal lines 30. Therefore, the second strip-shaped grooves 113 being parallel to the extending direction of the touch signal lines 30 may better prevent the touch electrode patterns and the touch signal lines from breaking due to the stress caused by folding of the display panel; the second strip-shaped groove 113 being perpendicular to the extending direction of the touch signal lines 30 may better allow the stress caused by folding released, thereby alleviating the breakage phenomenon of the touch electrode patterns and touch signal lines occurs due to being folded.

According to an embodiment of the present disclosure, referring to FIG. 10, the width D8 of the second strip-shaped grooves is 10-20 microns (such as 10 microns, 12 microns, 14 microns, 15 microns, 16 microns, 18 microns or 20 microns). The distance D7 between two adjacent second strip-shaped grooves is 5-8 microns (such as 5 microns, 6 microns, 7 microns, 8 microns or 9 microns). Therefore, the second strip-shaped grooves with the above size may effectively allow the stress caused by folding and curling of the insulating dielectric layer released, without affecting the service performances of the touch module. If the width of the second strip-shaped grooves is less than 10 microns, the effect of stress release is relatively poor. If the width of the second strip-shaped groove is greater than 20 microns, the manufacturing cost of the second strip-shaped groove may be increased, and overall performances of the touch module may be negatively affected to some extent. If the distance D7 between two adjacent second strip-shaped grooves is less than 5 microns, the insulating dielectric layer between the adjacent second strip-shaped grooves is prone to break when the display screen is folded and curled, accordingly affecting the performances of the touch module. If the distance D7 between two adjacent second strip-shaped grooves is larger than 8 microns, on the premise of a fixed frame region size, if the quantity of second strip-shaped grooves is less, the effect of stress release of the insulating dielectric layer will be relatively reduced then.

According to an embodiment of the present disclosure, the touch signal line 30 include a first touch signal line arranged on one side of the insulating dielectric layer 10 away from the substrate 51, and a second touch signal line arranged on one side of the insulating dielectric layer 10 close to the substrate 51. The first touch signal line is electrically connected to the second touch signal line through a second via penetrating the insulating dielectric layer. The first touch signal line is electrically connected to the first touch electrodes. The second touch signal line is electrically connected to the second touch electrodes. The first touch signal line is electrically connected to the second touch signal line through a second via penetrating through the insulating dielectric layer to achieve a parallel connection between the first touch signal line and the second touch signal line.

According to an embodiment of the present disclosure, hollow depth of the hollow patterns is less than or equal to thickness of the insulating dielectric layer. According to some embodiments of the present disclosure, hollow depth of the hollow patterns is equal to thickness of the insulating dielectric layer. That is, the hollow patterns penetrate the insulating dielectric layer. Therefore, the stress caused by curling and folding may be released in a better way.

Figure 12:
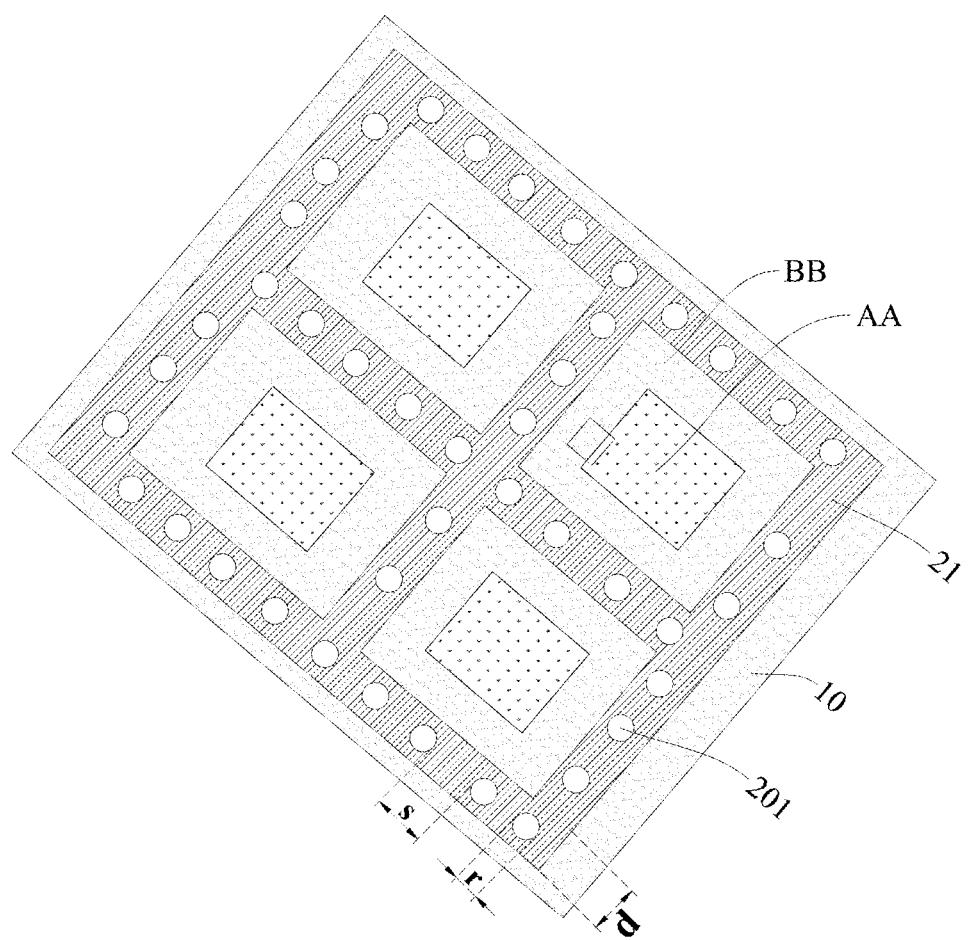
FIG. 12 is a structural schematic diagram of a touch module in a display panel according to yet another embodiment of the present disclosure.

According to an embodiment of the present disclosure, referring to FIG. 12, at least part of the grid structures has second via holes 201 penetrating the grid structures (taking the grid structures formed by the first touch electrodes as an example in FIG. 12). Therefore, due to the arrangement of the second via holes 201, the stress caused by folding and curling of the touch electrode patterns 20 (i.e., the grid structures) may be directly released, so as to avoid the breakage of the touch electrode patterns 20 affecting the signal transmission.

According to an embodiment of the present disclosure, referring to FIG. 12, the width of each of the grid structures is d, the inner diameter of a second via hole is r, and $d/4 \leq r \leq d/3$. The second via holes with the above size may effectively allow the stress released without affecting the signal transmission of touch electrode patterns, ensure good impedance of the touch electrode patterns, and ensure that when being folded and curled, the touch electrode patterns may not break due to a larger inner diameter of the second via holes relative to the width of the touch electrode patterns.

According to an embodiment of the present disclosure, d is 10-15 microns (such as 10 microns, 11 microns, 12 microns, 13 microns, 14 microns or 15 microns). As a result, the grid structures with the above width are convenient for manufacturing the second via holes with suitable inner diameter, and ensure that the width of part of the grid structures of the corresponding second via hole is not too small, thereby preventing the grid structures from breaking when being folded and curled. If d is less than 10 microns, the second via holes with smaller inner diameter may be made in order to avoid that the width of part of the grid structures of the second via holes is not too small, thus the effect of stress release is relatively reduced; or alternatively, on the premise of making the second via holes with suitable inner diameter, the width of the corresponding grid structures of the second via holes may be too small, and the part with too small size of the grid structures may easily break when being folded or curled. If d is larger than 15 microns, the width of the grid structures is too large, which firstly wastes raw materials and increases the cost, and secondly affects the light transmittance of the display screen with the touch module.

It should be noted that when the second via holes are not provided on the grid structures, there is no special requirement for the width of the grid structures. Those skilled in the art may select the conventional width of the grid structures according to actual requirements, which is generally about 3-4 microns.

According to an embodiment of the present disclosure, as shown in FIG. 12, the distance S between two adjacent second via holes 201 is 3-5 microns (such as 3 microns, 3.5 microns, 4 microns, 4.5 microns or 5 microns). Therefore, the density of the second via holes is set appropriately, which may not only allow the stress caused by folding and curling of the touch electrode patterns released better, but also not affect the performances of the touch electrode patterns. If the distance S between two adjacent second via holes 201 is less than 3 microns, then the density of the second via holes is large, which may affect the service performances of the touch module. If the distance S between two adjacent second via holes 201 is larger than 5 microns, the effect of stress release may be reduced relatively.

In another aspect of the present disclosure, the present application provides a display apparatus. According to an embodiment of the present disclosure, the display apparatus includes the aforementioned display panel. Therefore, when being folded or curled, the touch electrode patterns are not prone to break, which accordingly maintains good, sensitive and stable touch performances. Those skilled in the art may understand that the display apparatus is provided with all the features and advantages of the display panel and the touch module described above, which will not be described in detail here.

The specific products of the above display apparatus do not need to meet specific requirement, and may be flexibly selected by those skilled in the art according to actual situations. In some embodiments, the specific products of the above display apparatus include, but are not limited to, a mobile phone, a notebook, an iPad, a kindle, a game console or any other foldable display devices with display functions.

In another aspect of the present application, the present application provides a touch module. According to an embodiment of the present disclosure, referring to FIG. 12, the touch module includes an insulating dielectric layer 10, and touch electrode patterns 20 arranged on a surface of the insulating dielectric layer 10. The touch electrode patterns 10 include a plurality of first touch electrodes 21 distributed at intervals in a first direction, and a plurality of second touch electrodes 22 distributed at intervals in a second direction intersecting with the first direction and insulated and spaced apart from the first touch electrodes 21. Herein the first touch electrodes 21 and the second touch electrodes 22 both include a plurality of grid structures. At least a part of the grid structures has a plurality of second via holes 201 penetrating the grid structures. Therefore, due to the arrangement of the second via holes 201, the stress caused by folding and curling of the touch electrode patterns 20 may be directly released, so as to avoid breaking when the display screen is folded or curled and affecting the signal transmission.

According to an embodiment of the present disclosure, as shown in FIG. 12, the second via holes 201 are distributed in a row along the direction of the length extension of the grid structures.

According to an embodiment of the present disclosure, the specific structure of the touch module (including the insulating dielectric layer and the touch electrode patterns) is not particularly limited and may be flexibly selected by technicians according to specific conditions. In some embodiments, referring to FIG. 2 and FIG. 5 (FIG. 5 is a cross-sectional diagram of the touch module at the bridge electrodes 23 in FIG. 2), the first touch electrodes 21 and the second touch electrodes 22 are arranged on the same surface of the insulating dielectric layer 10. The first touch electrodes 21 include a plurality of first touch sub-electrodes 211 distributed at intervals along the second direction. The touch module further includes bridge electrodes 23. The bridge electrodes 23 are arranged on another surface of the insulating dielectric layer 10 away from the first touch electrodes 21. The first touch electrodes 21 include a plurality of first touch sub-electrodes 211 distributed at intervals along the second direction. In addition, the bridge electrodes 23 are electronically connected to two adjacent first touch sub-electrodes 211 through first via holes penetrating the insulting dielectric layer 10. In some other embodiments, the first touch electrodes 21 and the second touch electrodes 22 are respectively arranged on two surfaces opposite to each other of the insulating dielectric layer 10, and in this case there is no need to arrange a bridge electrode.

According to an embodiment of the present disclosure, as shown in FIG. 12, the width of each of the grid structures is d, the inner diameter of a second via hole is r, and $d/4 \leq r \leq d/3$. As a result, the second via holes with the above size may effectively allow stress released without affecting the signal transmission of touch electrode patterns, ensuring good impedance of the touch electrode patterns, and simultaneously ensuring that when being folded and curled, the touch electrode patterns may not break due to a larger inner diameter of the second via holes relative to the width of the touch electrode patterns.

According to an embodiment of the present disclosure, d is 10-15 microns (such as 10 microns, 11 microns, 12 microns, 13 microns, 14 microns or 15 microns). As a result, the grid structures with the above width are convenient for manufacturing the second via holes with suitable inner diameter, and ensure that the width of part of the grid structures of the corresponding second via holes is not too small, thereby preventing the touch electrode patterns from breaking when being folded and curled. If d is less than 10 microns, the second via holes with smaller inner diameter may be made in order to avoid that the width of part of the grid structures of the second via holes is not too small, thus the effect of stress release is relatively reduced; or alternatively, on the premise of making the second via holes with suitable inner diameter, the width of the corresponding grid structures of the second via holes may be too small, and the part with a narrow size of the grid structures may easily break when being folded and curled. If d is larger than 15 microns, the width of the grid structures is too large, which wastes raw materials and increases the cost on the one hand, and affects the light transmittance of the display screen with the touch module on the other hand.

It should be noted that when the second via holes are not provided on the grid structures, there is no special requirement for the width of the grid structures. Those skilled in the art may select the conventional width of the grid structures according to actual requirements, which is generally about 3-4 microns.

According to an embodiment of the present disclosure, as shown in FIG. 12, the distance S between two adjacent second via holes 201 is 3-5 microns (such as 3 microns, 3.5 microns, 4 microns, 4.5 microns or 5 microns). Therefore, the density of the second via holes is set appropriately, which may not only allow stress caused by folding and curling of the grid structures released better, but also not affect the performances of the grid structures. If the distance S between two adjacent second via holes is less than 3 microns, the density of the second via holes is high, which may affect the service performances of the touch module. If the distance S between two adjacent second via holes is larger than 5 microns, the effect of stress release may be reduced relatively.

According to an embodiment of the present disclosure, the insulating dielectric layer in the touch module may be further provided with hollow patterns penetrating the insulating dielectric layer. The requirements for the hollow patterns are consistent with those for the hollow patterns in the aforementioned display panel, which will not be described in detail here. As a result, the stress caused by bending of the touch electrode patterns may be further relieved and released, which consequently avoid the breakage of the touch electrode patterns.

In another aspect of the present application, the present application provides a touch module. According to an embodiment of the present application, referring to FIG. 2 to FIG. 9, the touch module includes an insulating dielectric layer 10 with a plurality of hollow patterns 11, touch electrode patterns 20, and a plurality of touch signal wires 30 distributed at intervals. The insulating dielectric layer 10 includes a touch region 12, a peripheral signal trace region 13 around the touch region 12, and a frame region 14 around the peripheral signal trace region 13. The plurality of touch electrode patterns 20 are arranged on a surface of the insulating dielectric layer 10 and located in the touch region 12. The touch electrode patterns include a plurality of first touch electrodes distributed at intervals in a first direction, and a plurality of second touch electrodes 22 distributed at intervals in a second direction intersecting with the first direction and insulated and spaced apart from the first touch electrodes 21. The touch signal lines 30 are arranged on a surface of the insulating dielectric layer 10 and located in the peripheral signal trace region 13. The touch signal lines 30 are electrically connected to the touch electrode patterns 20. Herein, the hollow patterns 11 are arranged around the touch electrode patterns 20 and/or the touch signal lines 30. At least part of the hollow patterns 11 does not overlap with the touch electrode patterns 20 and the touch signal lines 30. As a result, a plurality of hollow patterns are arranged in the insulating dielectric layer, so that during the curling and folding of the display panel or display screen with the touch module, the hollow patterns may effectively allow the stress caused by the curling and folding, thereby avoiding the breakage of the touch electrode patterns and the disconnection of the touch signal channels, namely effectively achieving the purpose of protecting the touch electrode patterns.

According to embodiments of the present disclosure, the specific structure of the touch module (including the insulating dielectric layer and the touch electrode patterns) is not particularly limited and may be flexibly selected by technicians according to specific conditions. In some embodiments, referring to FIG. 2 and FIG. 5 (FIG. 5 is a cross-sectional diagram of the touch module at the bridge electrodes 23 in FIG. 2), the first touch electrodes 21 and the second touch electrodes 22 are arranged on the same surface of the insulating dielectric layer 10. The first touch electrodes 21 include a plurality of first touch sub-electrodes 211 distributed at intervals along the second direction. The touch module further includes bridge electrodes 23. The bridge electrodes 23 are arranged on another surface of the insulating dielectric layer 10 away from the first touch electrodes 22. The first touch electrodes 21 include a plurality of first touch sub-electrodes 211 distributed at intervals along the second direction. In addition, the bridge electrodes 23 are electronically connected to two adjacent first touch sub-electrodes 211 through the first via holes penetrating the insulting dielectric layer 10. In some other embodiments, the first touch electrodes 21 and the second touch electrodes 22 are respectively arranged on two surfaces opposite to each other of the insulating dielectric layer 10, and in this case there is no need to arrange a bridge electrode.

It should be noted that one of a first touch electrode 21 and a second touch electrode 22 serves as a driving electrode (Tx) and the other serves as a sensing electrode (Rx).

According to an embodiment of the present disclosure, referring to FIG. 3 and FIG. 6, the plurality of hollow patterns 11 include a plurality of first strip-shaped grooves 111 (as shown in FIG. 6) and/or a plurality of first via holes distributed at intervals (as shown in FIG. 2). As a result, both the first strip-shaped grooves 111 and the first via holes 112 may effectively allow the stress caused by bending released, and are also convenient for manufacturing and designing in terms of process. In addition, in the case the hollow patterns are the first strip-shaped grooves, if the extension direction along the length of the first strip-shaped grooves is consistent with the folding direction of the display panel, the first strip-shaped grooves may provide a better stress release. There is no special requirement for the specific shape of the first via holes, and it may be any shape such as a circular shape, an oval shape, a rectangle shape, etc., which is not limited here.

According to an embodiment of the present disclosure, referring to FIG. 1 and FIG. 3, both the first touch electrodes 21 and the second touch electrodes 22 (taking the first touch electrodes 21 as an example in the figures) include a plurality of grid structures. The grid structures are polygonal (taking the quadrilateral shape as an example in FIG. 3), and an orthographic projection of which on the substrate does not overlap with the light-emitting regions AA. The hollow patterns 11 are a plurality of first via holes 112 distributed at intervals. The plurality of first via holes 112 are substantially arranged along the edge of the grid structures, and an orthographic projection of the plurality of first via holes 112 on the substrate 51 is located between an orthographic projection of the light-emitting regions AA on the substrate and an orthographic projection of the grid structures on the substrate 51. As a result, the arrangement of the first via holes will not negatively affect the light-emitting effect of the light-emitting regions and the image display of the display panel at the same time of achieving releasing stress.

According to an embodiment of the present disclosure, referring to FIG. 1 and FIG. 6, both the first touch electrodes 21 and the second touch electrodes 22 (taking the first touch electrodes 21 as an example in the figures) include a plurality of grid structures. The grid structures are polygonal (taking the quadrilateral shape as an example in FIG. 6), and an orthographic projection of which on the substrate does not overlap with the light-emitting regions AA. The hollow patterns 11 are a plurality of first strip-shaped grooves 111. The plurality of first strip-shaped grooves 111 are substantially arranged along at least one edge of the grid structures. At least part of the orthographic projection of the first strip-shaped grooves 111 on the substrate is located between an orthographic projection of the light-emitting regions AA on the substrate and an orthographic projection of the grid structures on the substrate. As a result, the arrangement of the first strip-shaped grooves will not negatively affect the light-emitting effect of the light-emitting region and the image display of the display panel simultaneously with the stress release.

According to an embodiment of the present disclosure, referring to FIG. 7 and FIG. 8 (FIG. 8 is a cross-sectional diagram along BB' of the touch module in FIG. 7), each of the light-emitting regions AA is located within one of the grid structures. The first strip-shaped grooves 111 intersect with a plurality of grid structures. Two adjacent first strip-shaped grooves 111 (i.e., two adjacent first strip-shaped grooves spanning the grid structures of the same column or same row) are respectively located on two sides opposite to each other of the light-emitting regions AA. As a result, it is convenient to manufacture the first strip-shaped grooves, and the stress may still be well released to protect the touch electrode pattern, without negatively affecting the light-emitting effect of the light-emitting regions and the image display of the display panel.

According to embodiments of the disclosure, requirements for the size of the first via holes and the first strip-shaped grooves are consistent with those for the size of the first via holes and the first strip-shaped grooves in the aforementioned display panel, which will not be described in detail here.

According to an embodiment of the present disclosure, referring to FIG. 10 and FIG. 11, the hollow patterns 11 are further arranged on one side of the touch signal lines 30 away from the touch region 12 (i.e., the hollow patterns 11 are also arranged in the frame region 14 of the insulating dielectric layer 10). Therefore, the arrangement of the hollow patterns in the frame region may better allow the stress caused by folding and curling of the insulating dielectric layer released, and further avoids the adverse phenomenon of breakage of the touch electrode patterns and the touch signal lines due to the unreleased stress of the insulating dielectric layer.

According to an embodiment of the present disclosure, referring to FIG. 10 and FIG. 11, the hollow patterns 11 are a plurality of second strip-shaped grooves 113. The extending direction of the second strip-shaped grooves 113 is parallel or perpendicular to the extending direction of the touch signal lines 30. Therefore, the second strip-shaped groove 113 being parallel to the extending direction of the touch signal lines 30 may better prevent the touch electrode patterns and the touch signal lines from breaking due to the stress caused by folding of the display panel; the second strip-shaped groove 113 being perpendicular to the extending direction of the touch signal lines 30 may better allow the stress caused by folding released, thereby alleviating the phenomenon of breakage of the touch electrode patterns and touch signal lines because of folding.

According to an embodiment of the disclosure, requirements for size of the second strip-shaped groove are consistent with those for size of the second strip-shaped groove in the aforementioned display panel, which will not be described in detail here.

In another aspect of the present disclosure, the present application provides a display apparatus. According to an embodiment of the present disclosure, the display apparatus includes the aforementioned touch module. Therefore, when being folded or curled, the touch electrode patterns are not prone to break, which consequently remains good, sensitive and stable touch performances. Those skilled in the art may understand that the display apparatus is provided with all the features and advantages of the display panel and the touch module described above, which will not be described in detail here.

The specific products of the above display apparatus are not particularly limited, and may be flexibly selected by those skilled in the art according to actual situations. In some embodiments, the specific products of the above display apparatus include, but are not limited to, a mobile phone, a notebook, an iPad, a kindle, a game console and any other foldable display devices with display functions.

In the description of this specification, the description with reference to the terms "an embodiment," "some embodiments," "examples," "specific examples," or "some examples" and the like means that a specific feature, structure, material, or characteristic described in connection with the embodiment or example is included in at least one embodiment or example of the present invention. In this specification, the schematic representation of the above-mentioned terms is not necessarily directed to the same embodiment or example. Moreover, the specific feature, structure, material, or characteristic described may be combined in any one or more embodiments or examples in a proper way. In addition, those skilled in the art may incorporate and combine different embodiments or examples and features of different embodiments or examples described in this specification if there is no conflict.

Although embodiments of the present invention have been shown and described above, it is to be understood that the above-mentioned embodiments are exemplary and should not be construed as limiting the present invention, and those of ordinary skilled in the art may make changes, modifications, substitutions and variations to the above-mentioned embodiments within the scope of the present invention.

What is claimed is:

1. A display panel, comprising:
a substrate;
a driving circuit structure layer, arranged on a surface of the substrate;
a light-emitting layer, arranged on a surface of the driving circuit structure layer away from the substrate, wherein the light-emitting layer comprises a plurality of light-emitting regions and non-light-emitting regions between two adjacent light-emitting regions;
an encapsulation layer, arranged on a surface of the light-emitting layer away from the substrate;
an insulating dielectric layer, arranged on a surface of the encapsulation layer away from the substrate, wherein the insulating dielectric layer is provided with a plurality of hollow patterns and comprises a touch region, a peripheral signal trace region around the touch region, and a frame region around the peripheral signal trace region;
a touch electrode pattern, arranged on a surface of the insulating dielectric layer and located in the touch region, wherein the touch electrode pattern comprises a plurality of first touch electrodes distributed at intervals in a first direction, and a plurality of second touch electrodes distributed at intervals in a second direction, insulated and spaced apart from the first touch electrodes, and wherein the first direction intersects with the second direction; and
a plurality of touch signal lines distributed at intervals, wherein the plurality of touch signal lines are arranged on a surface of the insulating dielectric layer and located in the peripheral signal trace region, and wherein the touch signal lines are electrically connected to the touch electrode pattern,
wherein the hollow patterns are arranged around the touch electrode pattern and/or the touch signal lines, an orthographic projection of at least part of the hollow patterns on the substrate does not overlap with orthographic projections of the touch electrode pattern and the touch signal lines on the substrate, and an orthographic projection of the hollow patterns on the substrate does not overlap with an orthographic projection of the light-emitting regions on the substrate.

2. The display panel of claim 1, wherein the first touch electrodes and the second touch electrodes are arranged on a same surface of the insulating dielectric layer, the display panel further comprises bridge electrodes arranged on another surface of the insulating dielectric layer away from the first touch electrodes, and wherein the first touch electrodes comprise a plurality of first touch sub-electrodes distributed at intervals along the second direction, and the bridge electrodes are electrically connected to two adjacent first touch sub-electrodes through first via holes penetrating the insulating dielectric layer.

3. The display panel of claim 1, wherein the plurality of hollow patterns comprise a plurality of first strip-shaped grooves and/or a plurality of first via holes distributed at intervals.

4. The display panel of claim 3, wherein the first touch electrodes and the second touch electrodes both comprise a plurality of grid structures, wherein the grid structures are polygonal, and an orthographic projection of the grid structures on the substrate does not overlap with the light-emitting regions; the hollow patterns are a plurality of the first via holes distributed at intervals, the plurality of the first via holes are substantially arranged along an edge of the grid structures; and an orthographic projection of the plurality of the first via holes on the substrate is located between an orthographic projection of the light-emitting regions and an orthographic projection of the grid structures on the substrate.

5. The display panel of claim 4, wherein at least part of the grid structures is provided with second via holes penetrating the grid structures.

6. The display panel of claim 5, wherein a width of each of the grid structures is d, an inner diameter of each of the second via holes is r, and $d/4 \leq r \leq d/3$.

7. The display panel of claim 6, wherein d is 10-15 microns, and a distance between two adjacent second via holes is 3-5 microns.

8. The display panel of claim 3, wherein the first touch electrodes and the second touch electrodes both comprise a plurality of grid structures, wherein the grid structures are polygonal, and an orthographic projection of the grid structures on the substrate does not overlap with the light-emitting regions; the hollow patterns are the plurality of first strip-shaped grooves substantially extending along at least one edge of the grid structures, and wherein at least part of an orthographic projection of the first strip-shaped grooves on the substrate is located between the orthographic projection of the light-emitting regions on the substrate and the orthographic projection of the grid structures on the substrate.

9. The display panel of claim 8, wherein each of the light-emitting regions is located in one of the grid structures; the first strip-shaped grooves intersect with the plurality of the grid structures; and two adjacent first strip-shaped grooves are respectively located on two sides opposite to each other of the light-emitting regions.

10. The display panel of claim 3, wherein the first via holes meet at least one of following conditions:

an inner diameter of the first via holes is 3-5 microns;
a distance between two adjacent first via holes is 3-5 microns;
a distance between first via holes and the first touch electrodes, and a distance between the first via holes and the second touch electrodes are less than or equal to 5 microns respectively;
a distance between the first via holes and the touch signal lines is less than or equal to 5 microns.

11. The display panel of claim 3, wherein the first strip-shaped groves meet at least one of following conditions:
a width of the first strip-shaped grooves is 3-5 microns;
a distance between the strip-shaped grooves and the first touch electrodes, and a distance between the strip-shaped grooves and the second touch electrodes are less than or equal to 5 microns respectively;
a distance between the first strip-shaped grooves and the touch signal lines is less than or equal to 5 microns.

12. The display panel of claim 1, wherein the hollow patterns are further arranged on a side of the touch signal lines away from the touch region.

13. The display panel of claim 12, wherein the hollow patterns are a plurality of second strip-shaped grooves, and an extending direction of the second strip-shaped grooves is parallel or perpendicular to an extending direction of the touch signal lines.

14. The display panel of claim 13, wherein a width of the second strip-shaped grooves is 10-20 microns, and a distance between two adjacent second strip-shaped grooves is 5-8 microns.

15. The display panel of claim 1, wherein the touch signal lines comprise a first touch signal line arranged on a side of the insulating dielectric layer away from the substrate, and a second touch signal line arranged on a side of the insulating dielectric layer close to the substrate; and the first touch signal line is electrically connected to the second touch signal line through a second via hole penetrating the insulating dielectric layer.

16. The display panel of claim 1, wherein a hollow depth of the hollow patterns is less than or equal to a thickness of the insulating dielectric layer.

17. The display panel of claim 1, further comprising:
a first electrode;
pixel defining layer, arranged on a surface of the driving circuit structure layer away from the substrate, and defining a plurality of pixel openings;
an organic light-emitting layer, arranged in the plurality of pixel openings; and
a second electrode, arranged on a side of the organic light-emitting layer away from the first electrode,
wherein an orthographic projection of the hollow patterns on the substrate is located within an orthographic projection of the pixel defining layer on the substrate.

18. A display apparatus, comprising the display panel of claim 1.

* * * * *